(12) United States Patent
Patelmo et al.

(10) Patent No.: US 6,281,077 B1
(45) Date of Patent: Aug. 28, 2001

(54) METHOD FOR MANUFACTURING ELECTRONIC DEVICES COMPRISING NON-VOLATILE MEMORY CELLS AND LV TRANSISTORS WITH SALICIDED JUNCTIONS

(75) Inventors: Matteo Patelmo, Trezzo sull'Adda; Giovanna Dalla Libera, Monza; Nadia Galbiati, Seregno; Bruno Vajana, Bergamo, all of (IT)

(73) Assignee: STMicroelectronics S.r. l., Agrate Brianza (IT)

( * ) Notice: Subject to any disclaimer, the term of this patent is extended or adjusted under 35 U.S.C. 154(b) by 0 days.

(21) Appl. No.: 09/392,937

(22) Filed: Sep. 9, 1999

(30) Foreign Application Priority Data

Sep. 11, 1998 (EP) .................................................. 98830532
Oct. 23, 1998 (EP) .................................................. 98830645

(51) Int. Cl.[7] ...................... H01L 21/336; H01L 21/8238
(52) U.S. Cl. ......................... 438/258; 438/257; 438/264; 438/201; 438/594
(58) Field of Search ..................................... 438/197, 201, 438/211, 229–232, 257, 258, 264, 299, 301, 593, 594; 257/316, 322

(56) References Cited

U.S. PATENT DOCUMENTS 5,550,072   8/1996   Cacharelis et al. ................... 437/43
5,751,631 * 5/1998   Liu et al. ..
5,861,347 * 1/1999   Maiti et al. ..
6,174,758 * 1/2001   Nachumovsky .
6,177,306 * 1/2001   Wu .

FOREIGN PATENT DOCUMENTS 0 811 983 A1   12/1997   (EP) .
08023041        1/1996   (JP) .
09283643       10/1997   (JP) .

* cited by examiner

Primary Examiner—Charles Bowers
Assistant Examiner—Stephen W. Smoot
(74) Attorney, Agent, or Firm—Theodore E. Galanthay; E. Russell Tarleton; Seed IP Law Group PLLC

(57) ABSTRACT

A method for manufacturing electronic devices, such as memory cells and LV transistors, with salicided junctions, that includes: depositing an upper layer of polycrystalline silicon; defining the upper layer, obtaining floating gate regions on first areas, LV gate regions on second areas of a substrate, and undefined regions on the first and third areas of the substrate; forming first cell source regions laterally to the floating gate regions; forming LV source and drain regions laterally to the LV gate regions; forming a silicide layer on the LV source and drain regions, on the LV gate regions, and on the undefined portions; defining HV gate regions on the third areas, and selection gate regions on the first areas; forming source regions laterally to the selection gate regions, and source and drain regions laterally to the HV gate regions.

13 Claims, 10 Drawing Sheets

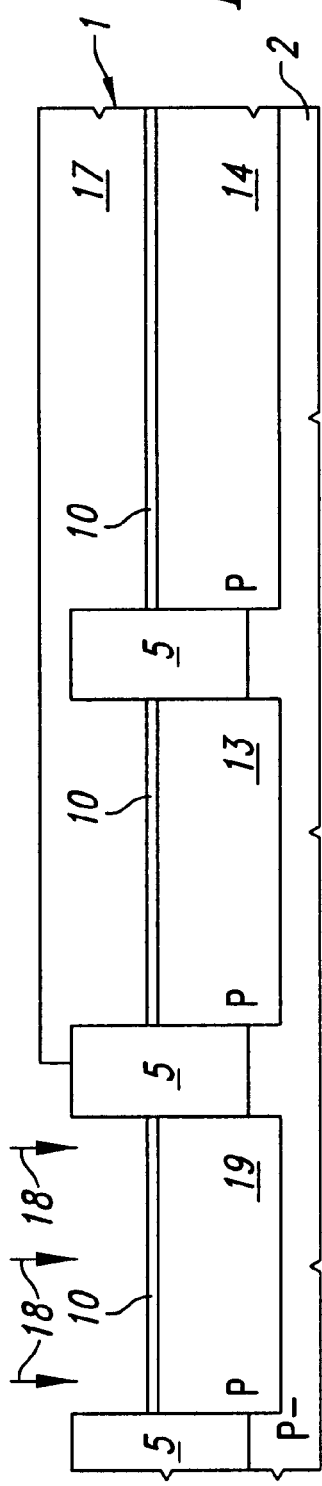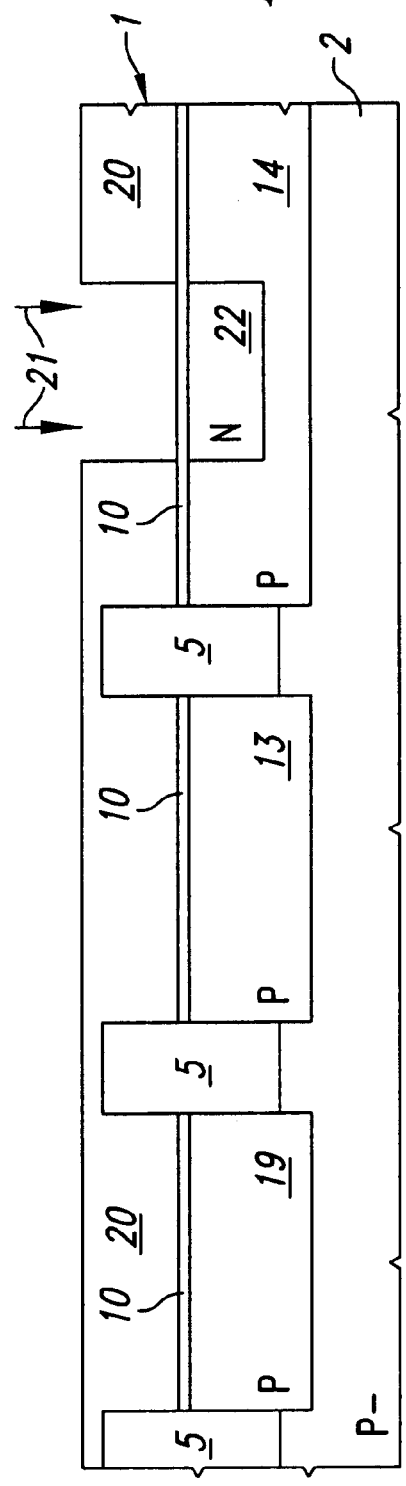

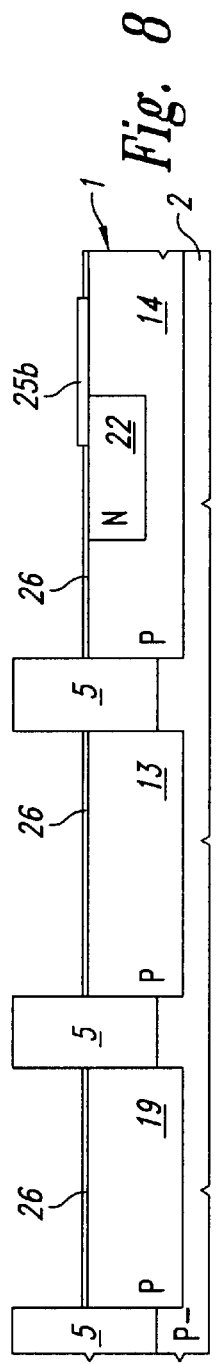
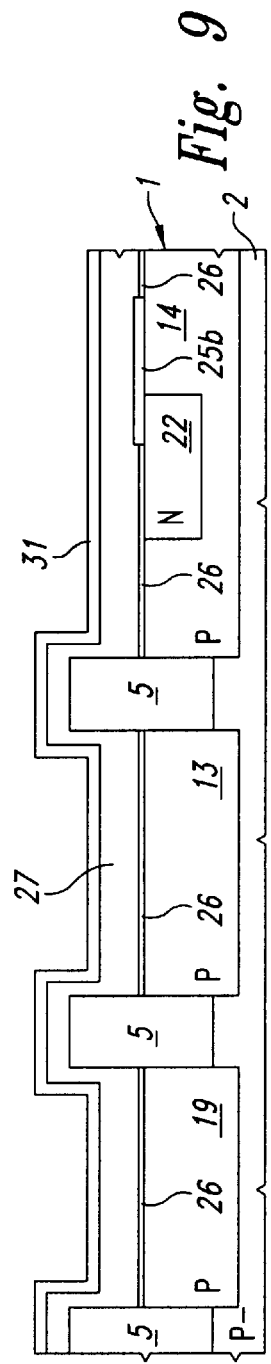
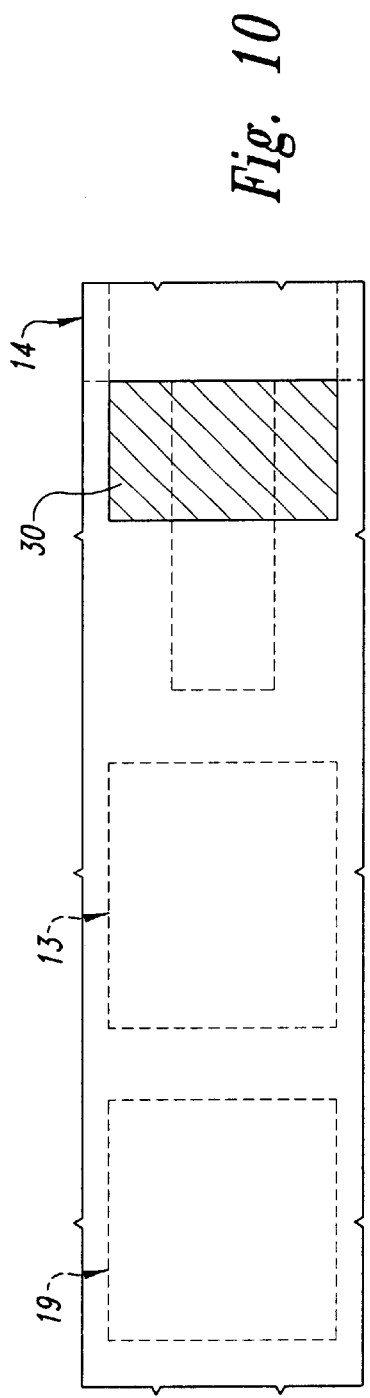

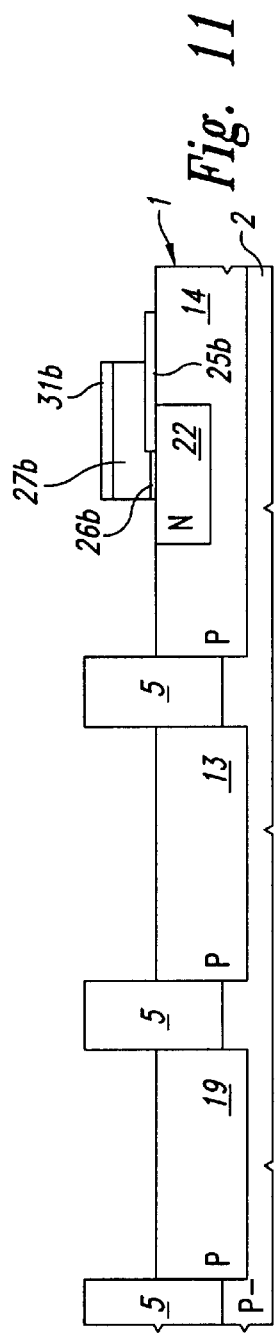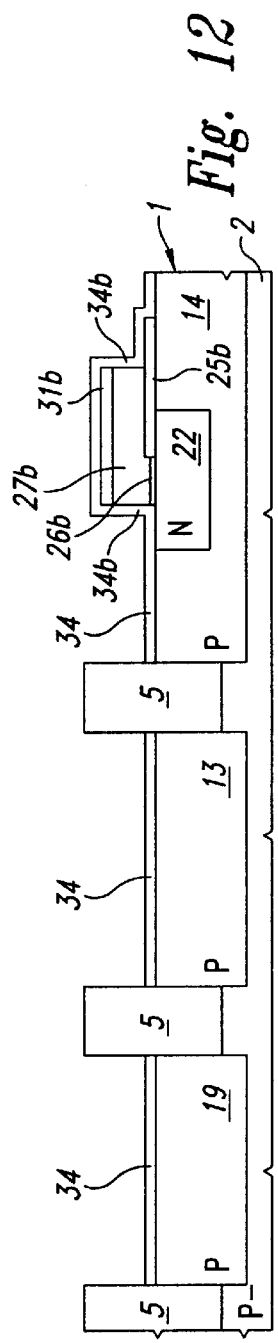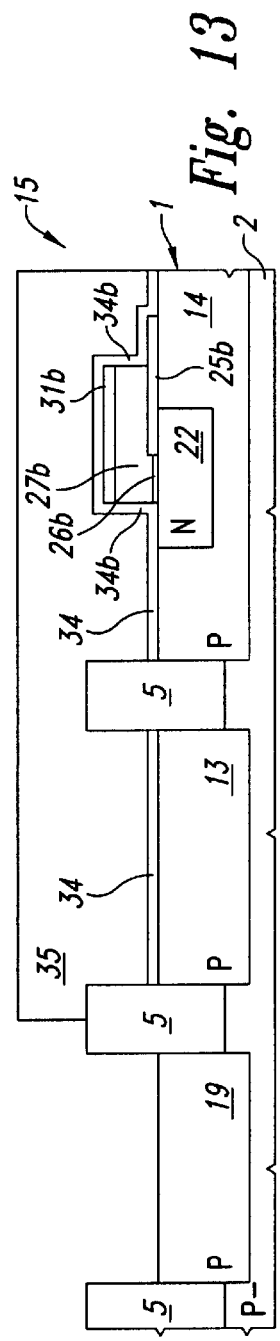

METHOD FOR MANUFACTURING ELECTRONIC DEVICES COMPRISING NON-VOLATILE MEMORY CELLS AND LV TRANSISTORS WITH SALICIDED JUNCTIONS

TECHNICAL FIELD

The present invention relates to a method for manufacturing electronic devices comprising non-volatile memory cells and LV transistors with salicided junctions, and using a small number of masks.

BACKGROUND OF THE INVENTION

In advanced processes (gate lengths of 0.35 µm or less), the need has recently arisen to integrate EEPROM-type non-volatile memories in high-speed devices that use the technique of saliciding the diffusions. As known, this technique is based on the use of a layer of self-aligned silicide ("salicide" from "Self-Aligned Silicide"), which reduces the resistivity of the junctions. The layer of salicide (which typically comprises titanium, but can also be cobalt or another transition metal) is formed by depositing a titanium layer on the entire surface of the device, and performing a heat treatment that makes the titanium react with the silicon, which is left bare on the junctions and the gate regions, such as to form titanium silicide. Subsequently, the nonreacted titanium (for example that deposited on oxide regions), is removed by etching with an appropriate solution, which leaves the titanium silicide intact. Thereby, both the gate regions and the junctions have in parallel a silicide layer with low resistivity (approximately 3–4 Ω/square), which reduces the series resistance at the transistors. The salicide technique is described for example in the article "Application of the self-aligned titanium silicide process to very large-scale integrated n-metal-oxide-semiconductor and complementary metal-oxide-semiconductor technologies" by R.A. Haken, in *J. Vac. Sci. Technol. B*, vol 3, No. 6, Nov/Dec 1985.

The high voltages necessary for programming non-volatile memories (higher than 16 V) are however incompatible with saliciding the memory cells diffusions, since the breakdown voltage of the salicided junctions is lower than 13 V.

Process flows are thus being designed which permit integration of non-volatile memory cells and high-speed transistors with saliciding; however this integration is made difficult by the fact that these components have different characteristics, and require different process steps.

SUMMARY OF THE INVENTION

The invention provides a method for manufacturing non-volatile cells and high-speed transistors with a small number of masks, which is simple, and has the lowest possible costs.

According to the present invention, a method is provided for manufacturing of electronic devices comprising non-volatile memory cells and LV transistors with salicided junctions, and to the resulting electronic device.

BRIEF DESCRIPTION OF THE DRAWINGS

To assist understanding of the present invention, an embodiment is now described, purely by way of non-limiting example, with reference to the attached drawings, in which:

FIGS. 3–6 show cross-sections similar to FIG. 1, in successive manufacturing steps;

FIGS. 8–9 show cross-sections similar to FIG. 6, in successive manufacturing steps;

FIG. 10 shows a top view of the wafer of FIG. 9;

FIGS. 11–16 show cross-sections similar to FIG. 9, in successive manufacturing steps;

DETAILED DESCRIPTION OF THE INVENTION

The following description relates to the manufacturing of LV (low voltage and high speed) and HV (high voltage) NMOS transistors, LV and HV PMOS transistors, and EEPROM memory cells, having a selection transistor and a memory transistor. In particular, in view of the duality in manufacturing NMOS and PMOS transistors, the drawings show only the steps relative to NMOS transistors, and the steps relative to PMOS transistors are described in words alone. The EEPROM memory cells form a memory matrix and are formed in a part of the wafer referred to hereinafter as a matrix zone 15.

Figure 1:
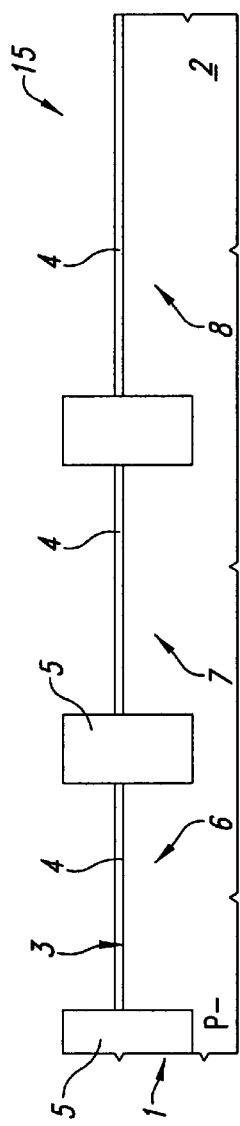
FIG. 1 shows a cross-section through a silicon wafer, in a first step of the manufacturing method according to the invention.

In FIG. 1, a wafer 1, formed from a monocrystalline silicon substrate 2, here of P-type, has been subjected to the steps of defining the active areas. In detail, with the surface 3 of the substrate 2 covered by an active area mask 4 made of non-oxidisable material (typically including a double layer of silicon oxide and silicon nitride, defined using resist), the wafer 1 has been subjected to thermal oxidation; consequently, on the parts of the substrate 2 which are not covered by the active area mask 4, thick oxide (field oxide) layers 5 have been grown, delimiting between one another substrate active areas designed to accommodate various components of the device to be formed. In particular, FIG. 1 shows three active areas, an active LV area 6, designed to accommodate an LV NMOS transistor, an active HV area 7, designed to accommodate an HV NMOS transistor, and an active matrix area 8, designed to accommodate EEPROM memory cells.

Figure 2:
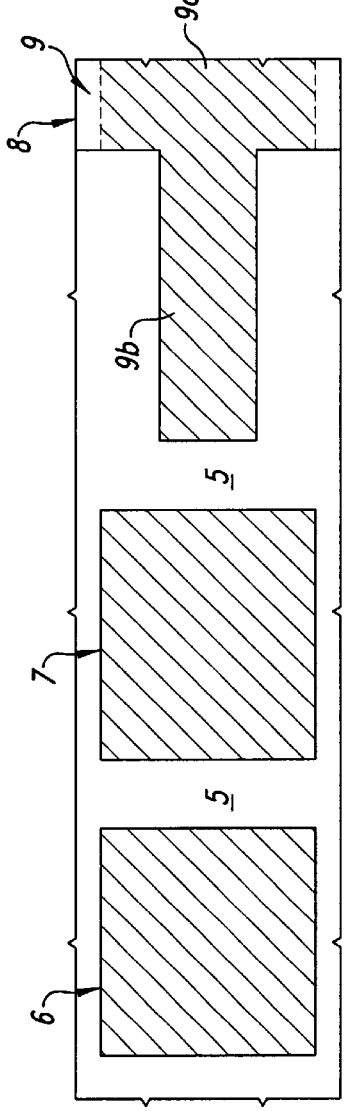
FIG. 2 shows a top view of the wafer of FIG. 1.

In detail, and in known manner, the active matrix area 8 defines a grid, of which FIG. 2 shows in full only the part relative to a cell, indicated at 9, which has substantially the shape of a "T" rotated by 90°, and comprises a leg 9a (far from active HV area 7) and a cross-piece 9b. Leg 9a is adjacent and electrically connected to respective legs 9a of other cells arranged above and below the cell shown, and of which only parts are shown; in addition, the leg 9a is connected to a leg of an adjacent cell to the right (not shown), which has a structure which is symmetrical relative to that shown. The legs 9a are designed to accommodate source regions of the memory transistors; the end of cross-pieces 9b are designed to accommodate drain regions of the selection transistors and gate regions of the cells must be formed on the cross-pieces 9b. Further active areas are generally formed to accommodate LV or HV PMOS transistors, not shown in the drawings.

Figure 3:
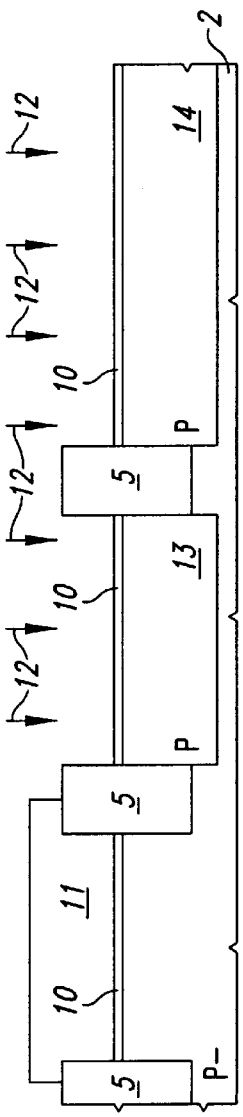
Figure 7:
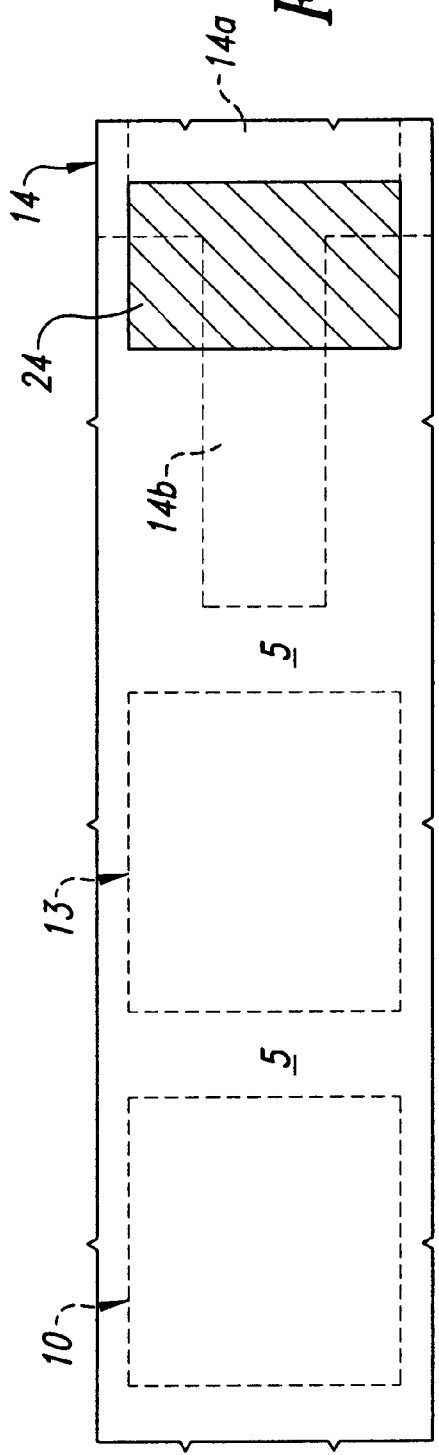
FIG. 7 shows a top view of the wafer of FIG. 6.

Subsequently active area mask 4 is removed, the free surface 3 of the substrate is oxidized to form a sacrificial oxide layer 10, and masked implanting of doping ion species of N-type is carried out, to form N-HV regions (not shown) for HV PMOS transistors; then, using an HV P-well resist mask 11, which covers the entire surface of the wafer 1, except HV active area 7 and matrix area 8, implanting of doping ionic species of P-type is carried out, as shown schematically in FIG. 3 by arrows 12. Then P-HV regions 13 of P-type for high-voltage transistors, and a P-matrix region 14, also of P-type, for cells, is formed in the substrate 2, as shown in FIG. 3. P-HV region 13 and P-matrix region 14 reproduce exactly the shape of the respective HV active area 7 and matrix area 8, and thus, each cell comprises legs 14a (corresponding to legs 9a of the active areas of cell 9, see FIG. 7), and cross-pieces 14b (FIG. 7, corresponding to the cross-pieces 9b).

After HV P-well mask 11 has been removed, masked implanting of doping ionic species of N-type is carried out, to form N-LV regions (not shown) for LV PMOS transistors; then, using an LV P-well resist mask 17 that covers the entire surface of the wafer 1, except LV active areas 6, doping ionic species of P-type are implanted, as shown schematically in FIG. 4 by arrows 18. P-LV regions 19 of P-type for LV NMOS transistors are then formed in substrate 2, as shown in FIG. 4. Thereby, P-HV regions 13 and P-LV regions 19 are separated from one another, and their electrical characteristics can be optimized to the required electrical characteristics.

After LV P-well mask 17 has been removed, a capacitor mask 20 is formed, which covers the entire surface of the wafer 1, except strips perpendicular to the cross-pieces 14b. Doping species of N-type (for example phosphorous) are then implanted, as shown schematically in FIG. 5 by arrows 21. In the cross-pieces 14b, continuity regions 22 of N-type are thus formed, as necessary for electrical continuity between each selection transistor and the respective memory transistor of each cell. The structure of FIG. 5 is thus obtained.

Figure 6:
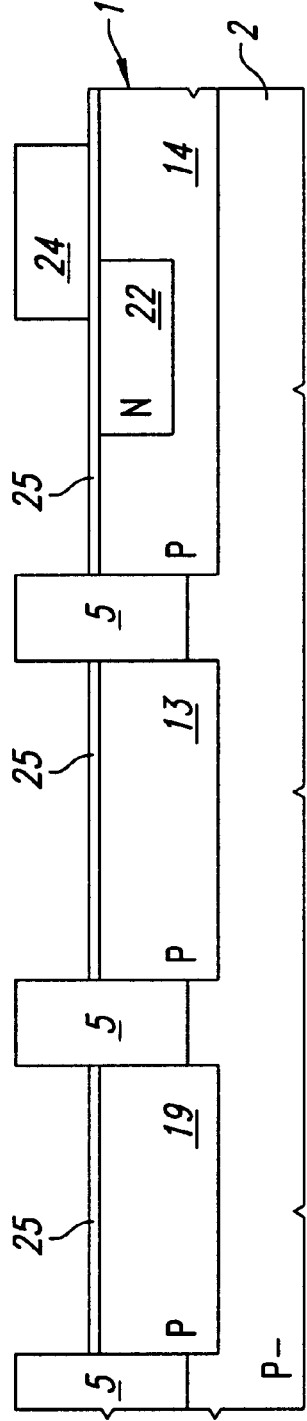

After capacitor mask 20 has been removed, wafer 1 is subjected to annealing, sacrificial layer 10 is removed, and matrix oxidation is carried out, leading to a matrix oxide layer 25 forming on the surface of all the regions 13, 14 and 19. Then, using a matrix oxide mask 24, shown in cross-section in FIG. 6, and from above in FIG. 7, the matrix oxide layer is removed everywhere except from below the matrix oxide mask 24, forming a region 25b (FIG. 8) arranged partially above the continuity region 22 and partially covering the leg 9a; after matrix oxide mask 24 has been removed, wafer 1 is oxidized again, forming a tunnel oxide region 26 on the entire surface of the active areas. The structure in FIG. 8 is thus obtained.

A first polycrystalline silicon layer (poly1 layer) 27 is then deposited and suitably doped; an interpoly dielectric layer 31 is then formed, for example comprising a triple layer of ONO (silicon oxide-silicon nitride-silicon oxide), as shown in FIG. 9.

A floating gate mask 30, shown in FIG. 10, is formed; then dielectric layer 31, poly1 layer 27, and tunnel oxide layer 26 are removed from everywhere except where floating gate regions of the memory transistors are to be formed, as indicated at 27b in FIG. 11. Consequently, of tunnel oxide layer 26, only a tunnel region 26b is left, which is adjacent to an edge of floating gate region 27b of the memory transistor.

After floating gate mask 30 has been removed, an HV oxidation step is carried out, forming an HV gate oxide layer 34 on the entire free surface of substrate 2, and in particular on regions P-LV 19 and P-HV 13 (FIG. 12). Oxide portions 34b are also formed laterally to the floating gate region 27b of the memory transistor, as shown in FIG. 12. Subsequently, using an HV resist oxide mask 35, which covers regions P-HV 13 and matrix zone 15, HV gate oxide layer 34 is removed from above regions P-LV 19 (FIG. 13).

Figure 14:
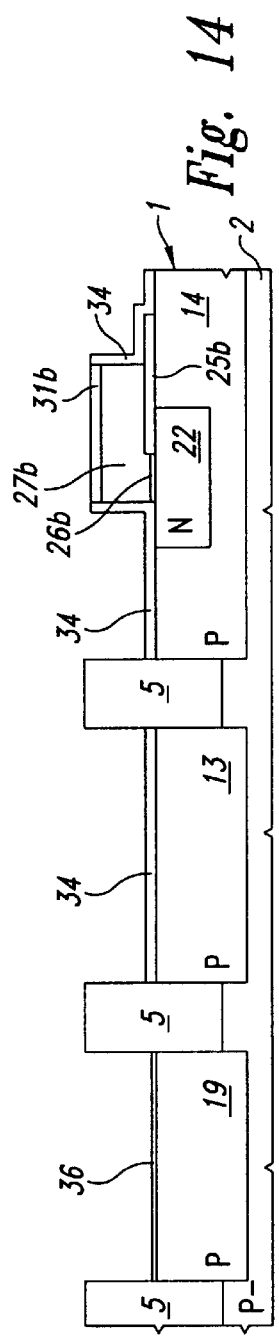

After HV oxide mask 35 has been removed, an LV oxidation step is carried out, forming an LV gate oxide layer 36 on regions P-LV 19; in addition, the thickness of HV gate oxide layer 34 on P-HV regions 13 increases, providing the intermediate structure of FIG. 14.

Figure 15:
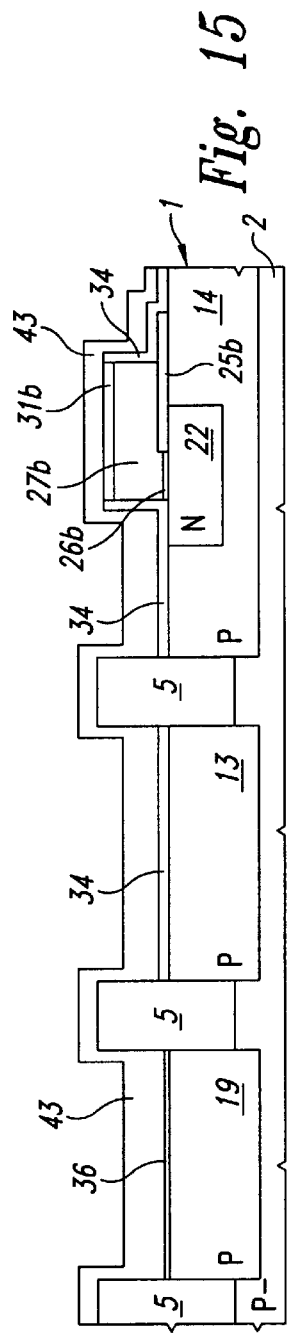
Figure 16:
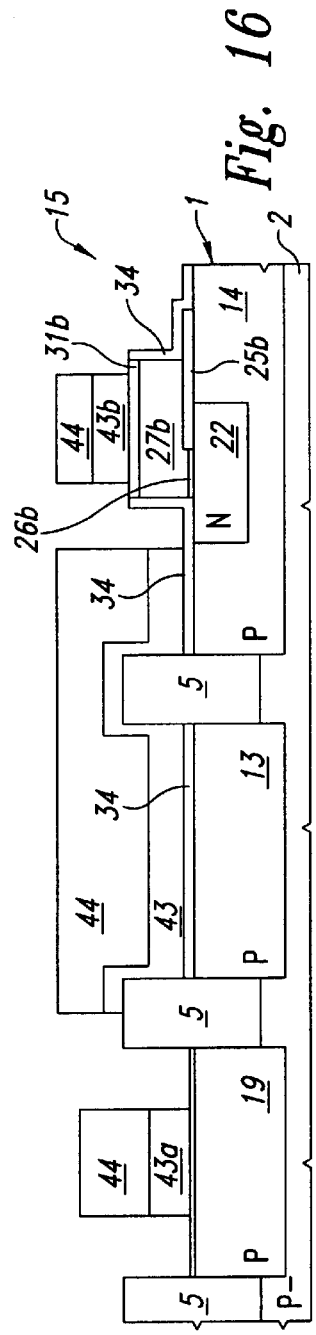
Figure 17:
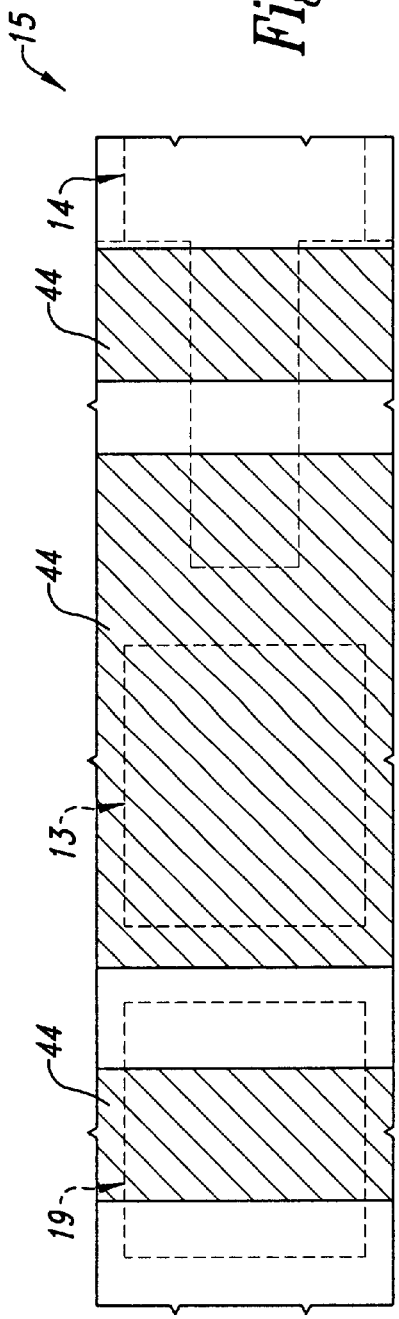
FIG. 17 shows a top view of the wafer of FIG. 16.

A second polycrystalline layer (poly2 layer 43) then is deposited and doped, as shown in FIG. 15. An LV gate mask 44 is then formed, which covers regions N-HV (not shown), regions P-HV 13, and matrix zone 15, except where cell source regions and cell drain regions are to be formed, such as to define both sides of the control gate regions of the memory transistors, and one side (facing the respective memory transistor) of gate regions of selection transistors. In addition, LV gate mask 44 covers poly2 layer on regions P-LV 19, where gate regions of LV NMOS and PMOS transistors are to be defined, as shown in FIGS. 16 and 17, and N-LV regions (not shown), where gate regions of LV PMOS transistors are to be defined. The exposed portions of poly2 layer 43 are then removed, providing the intermediate structure of FIG. 16, wherein the remaining portions of poly2 on regions P-LV 19 form gate regions 43a of LV NMOS transistors, and the remaining portions of poly2 on P-matrix regions 14 form control gate regions 43b of the memory transistors. As is known, while defining the gate regions of LV transistors, the layers on regions P-HV 13 are protected, as are the layers on regions N-HV (not shown); consequently, the method described provides separate definition of the gate regions of the LV transistors and the HV transistors.

Figure 18:
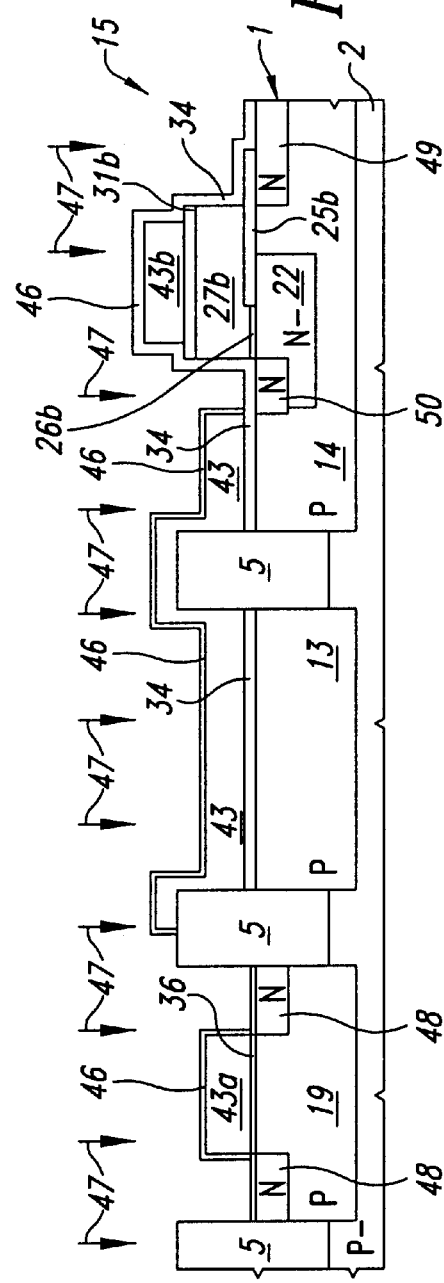
FIGS. 18–21 show cross-sections similar to FIG. 16, in successive manufacturing steps.

After LV gate mask 44 has been removed, wafer 1 is subjected to oxidation, such that an oxide layer 46 grows on the exposed portions of the poly2 layer. Using a resist mask, not shown, which covers regions N-LV and N-HV, doping ionic species of N-type (LDDN implanting) are implanted, as schematized by arrows 47 in FIG. 18. At the sides of gate regions 43a (inside regions P-LV 19), LDD regions 48 of N-type are then formed; and at the sides of gate region 27b (inside P-matrix region 14), first cell source regions 49 of N-type, and drain regions 50 of N-type, also defining source regions of selection transistors, are formed; in addition, poly2 layer 43 is suitably doped. The structure of FIG. 18 is thus obtained.

After the resist mask (not shown) has been removed, masked implanting of doping ionic species of P-type is carried out; in particular, during this step, regions P-HV 13 and P-LV 19, as well as matrix zone 15 are covered, whereas in regions N-LV, LDD regions of P-type (not shown) are formed. A dielectric layer (for example TEOS-TetraEthylOrthoSilicate) is then deposited on the entire surface of wafer 1; then, in known manner, the TEOS layer is subjected to anisotropic etching and is removed completely from the horizontal portions, remaining only at the sides of the gate regions 43a (where it forms spacers 52, FIG. 19), on the side of the floating gate region 27b and control gate region 43b of the memory transistors which does not face the respective selection transistor (on the source region 49, where it forms spacers 53b), on the side of the floating gate region 27b and the control gate region 43b of the memory transistors which faces the respective selection transistor (on the drain region 50, where it forms spacers 53a), as well as on the side already defined of the poly2 layer 43, which is designed to form the gate region of the selection transistors (where it forms spacers 53c). In particular, the spacers 53b and 53c on each drain region 50 are connected to one another, forming a single region which protects the drain region 50 beneath. On the other hand, spacers are not formed above field oxide regions 5, since the edges of the latter are birds beak-shaped (formed in known manner, not shown for simplicity); in addition, no spacers are formed above regions P-HV 13, and corresponding regions N-HV, since the gate regions of the HV transistors are not yet defined. The oxide layer 46 is also removed in this step.

Figure 19:
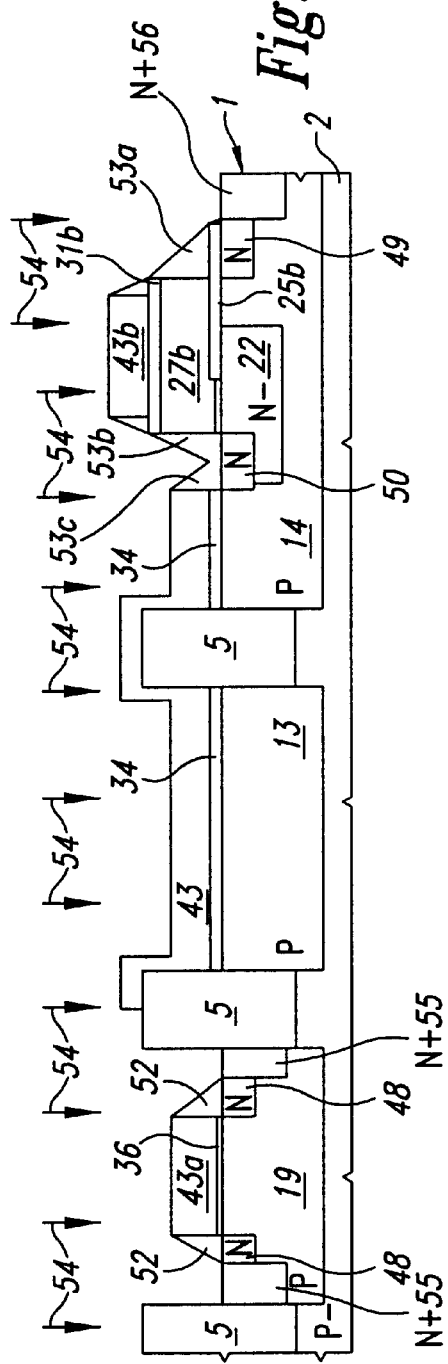

Subsequently, using a resist mask, not shown, which covers regions N-LV and N-HV, doping ionic species of N-type are implanted, as schematically shown in FIG. 19 by arrows 54. LV-NMOS source and drain regions 55 of N+-type are then formed in regions P-LV 19, self-aligned with spacers 52, and second cell source regions 56 of N+-type are formed self-aligned with spacers 53a in P-matrix region 14. LV-NMOS source and drain regions 55 are more highly doped than LDD regions 48, and second source regions 56 are more highly doped than first cell source regions 49. In addition, poly2 layer 43 and gate regions 43a are N-doped, while covering the zones where HV and LV PMOS transistors are to be formed. Thus the structure of FIG. 19 is obtained.

After resist mask (not shown) has been removed, analogously doping ionic species of P-type are masked implanted, to form respective source and drain regions in regions of N-LV type (not shown), and for P-type doping of poly2 layer 43 above N-LV and N-HV regions. In this step, P-LV, P-HV and P-matrix regions are fully covered.

Subsequently, if zener diodes, low-doping precision resistors, and/or transistors of N- and P-type with non-salicided junctions are to be provided, a dielectric layer is deposited and defined through a respective mask, in a manner not shown.

Figure 20:
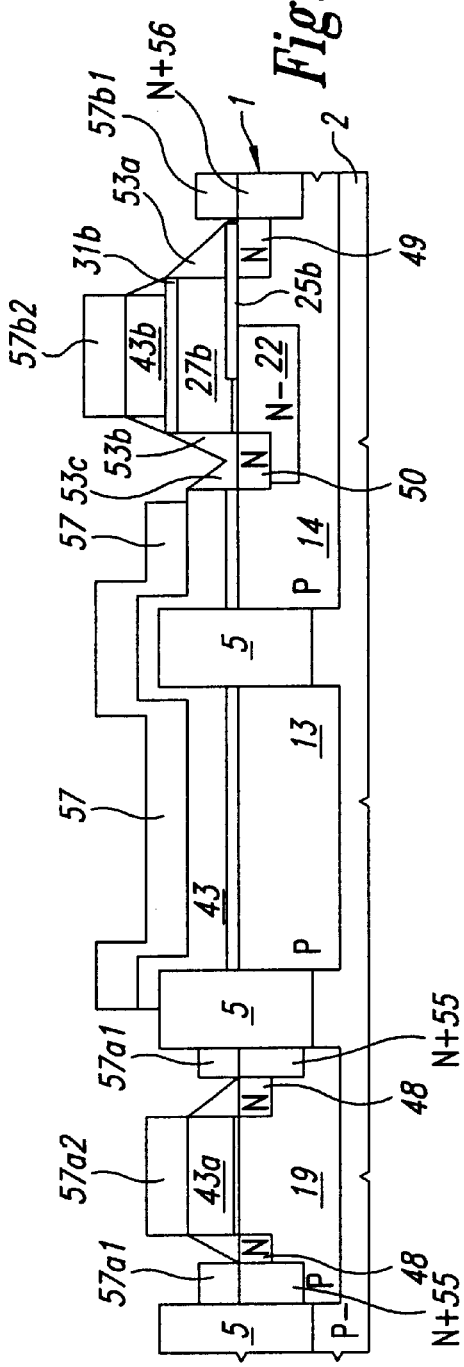

The exposed poly2 layer is then salicized. Saliciding, carried out in known manner, as already described, causes the formation of titanium silicide regions above the source and drain regions of the LV NMOS and PMOS transistors (silicide regions 57a1 above LV-NMOS source and drain regions 55, and similar regions for LV PMOS transistors), above the gate regions of LV NMOS and PMOS transistors (silicide regions 57a2 above gate regions 43a for LV NMOS transistors, and similar regions for LV PMOS transistors), above second cell source regions 56 (silicide regions 57b1), above control gate regions 43b of memory transistors (salicide regions 57b2) and the regions where gate regions of selection transistors and of HV NMOS and similar HV PMOS transistors are to be formed, as shown in FIG. 20.

Figure 21:
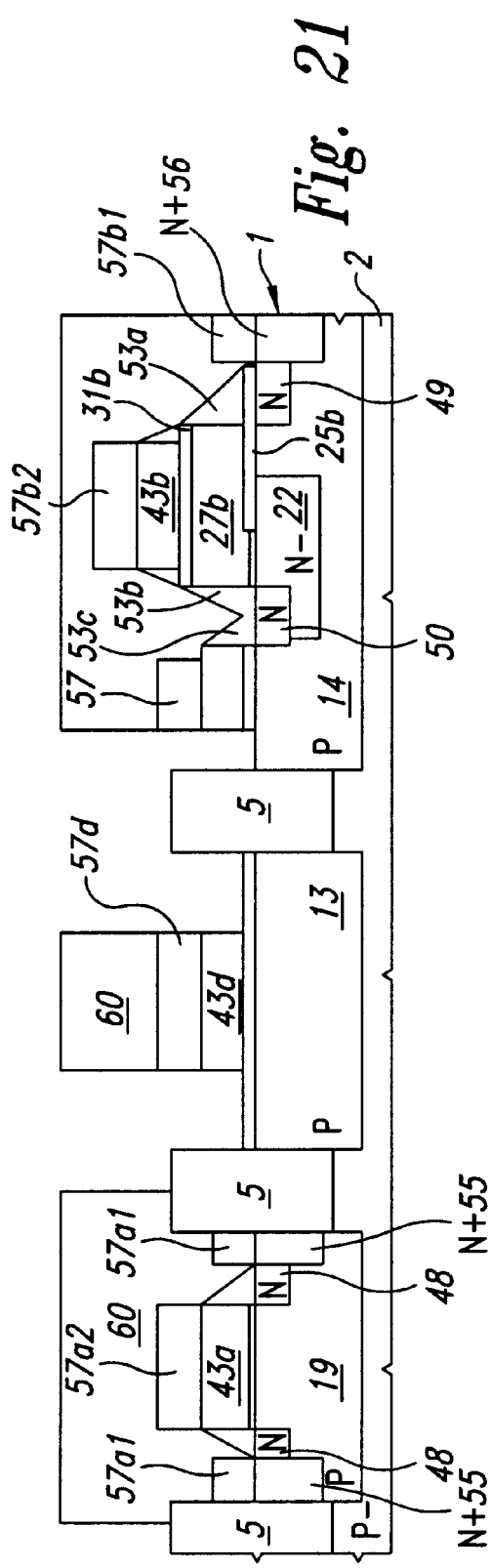
Figure 22:
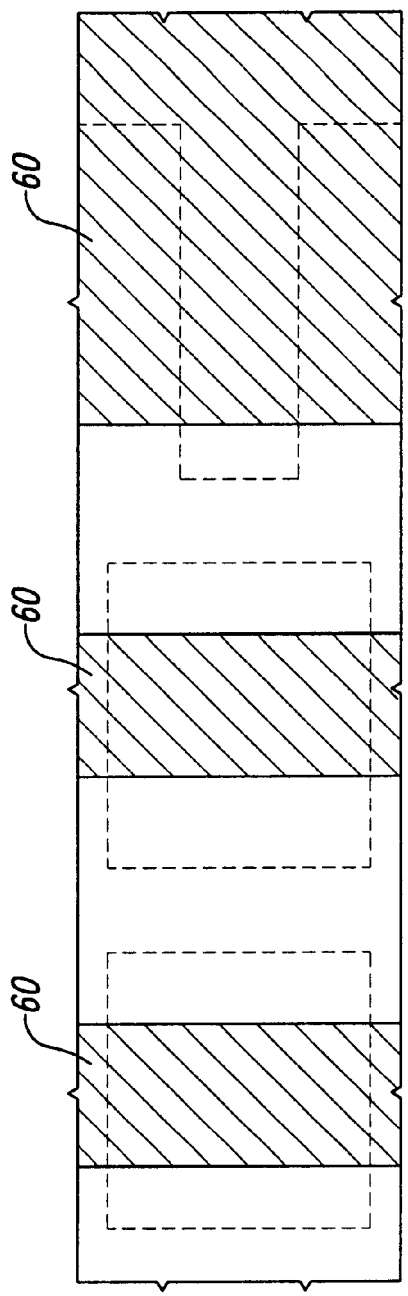
FIG. 22 shows a top view of the wafer of FIG. 21.

Subsequently, an HV gate mask 60 is formed, which covers the entire surface of wafer 1, except the active areas where high voltage transistors are to be formed (P-HV regions 13, for HV NMOS), and a portion of P-matrix region 14 designed to form the source of the selection transistor; in particular, mask 60 covers the zones where to form the gate regions of high voltage transistors and the side of the gate regions of selection transistors not facing the respective memory transistor (in this respect see also FIG. 22, which shows HV gate mask 60 from above). The portions of silicide layer 57 and poly2 layer 43b not covered by the HV gate mask 60 are then etched. Thus, the structure of FIG. 21 is obtained, wherein the gate region of the memory transistor is indicated at 43c, and the gate region of HV NMOS transistor is indicated at 43d; the respective portions of salicide are indicated at 57c and 57d. In practice, definition of regions 43c and 43d takes place after saliciding, and causes removal of the salicide (together with poly2 layer 43), on the high voltage junctions on which silicide must not be present.

Figure 23:
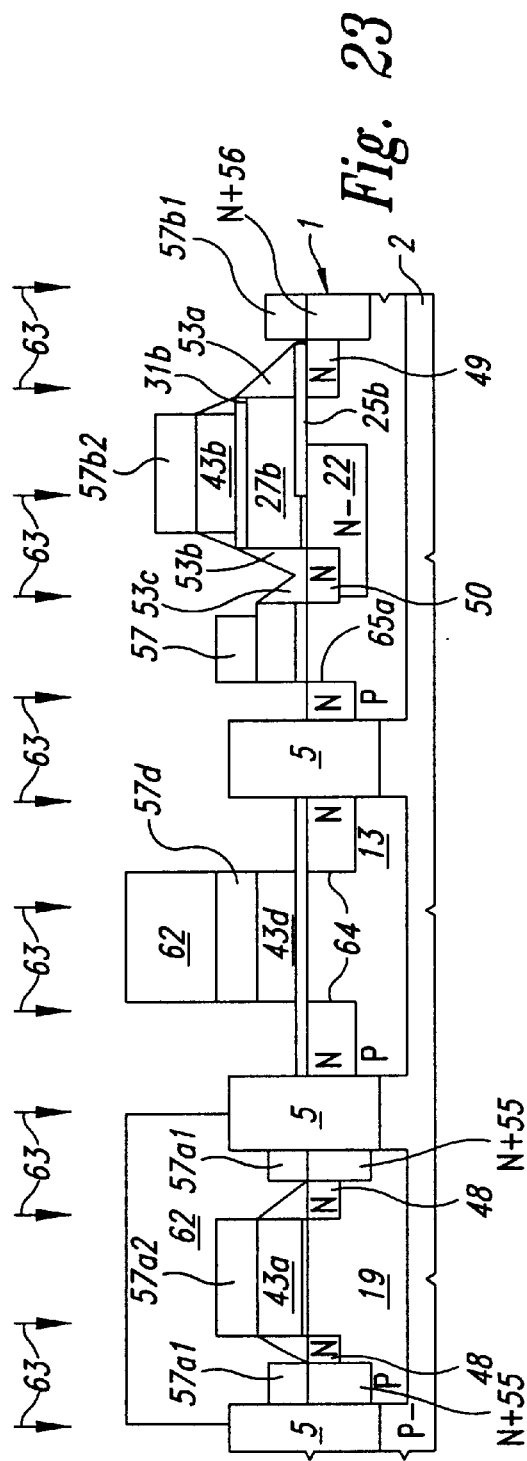
FIGS. 23–24 show cross-sections similar to FIG. 21, in successive manufacturing steps.

After HV gate mask 60 has been removed, an N-HV mask 62 is formed, which covers N-LV and N-HV regions (not shown), and P-LV regions 19. Using NHV mask 62, doping ionic species of N-type are implanted, as shown schematically in FIG. 23 by arrows 63. In P-HV regions 13, at both sides of HV gate regions 43d, HV-NMOS source and drain regions 64 of N-type are thus formed, which are less doped than LV-NMOS source and drain regions 55; simultaneously, in P-matrix region 14, selection transistor source regions 65a are formed, on one side, self-aligned with gate region 43c of selection transistors. Selection transistor source regions 65a (as well as HV-NMOS source and drain regions 64) have a doping level lower than LV-NMOS source and drain regions 55, and than second cell source regions 56, and thus they have a higher breakdown voltage, as well as greater resistivity.

Figure 24:
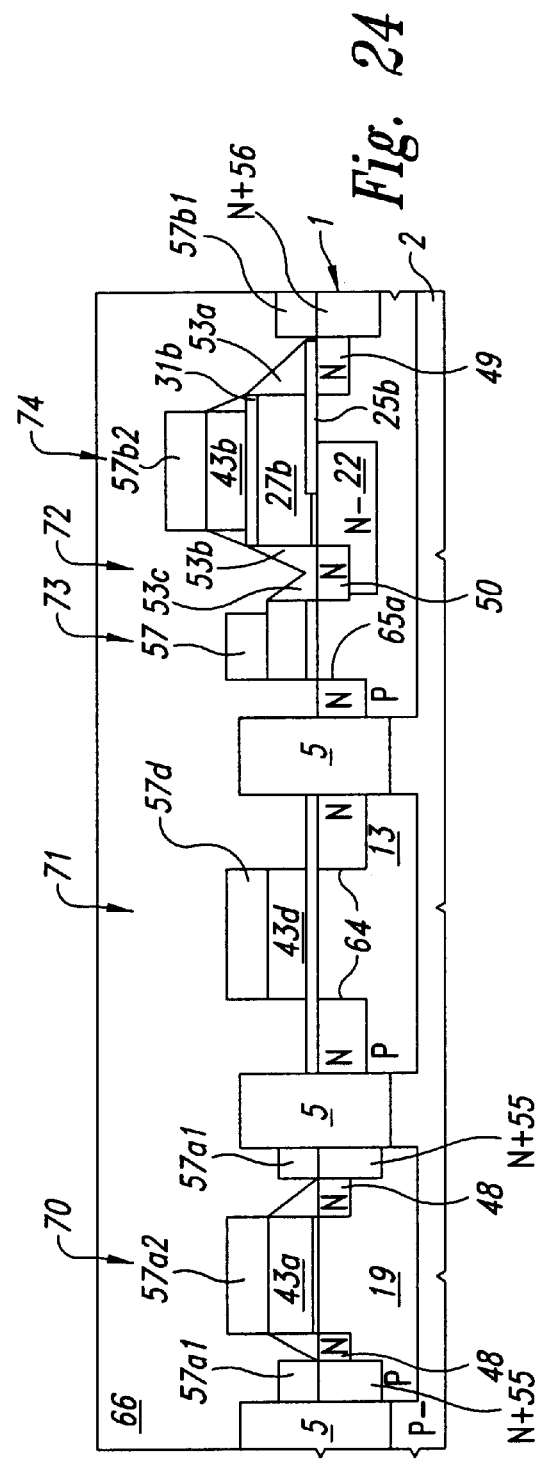

After NHV mask 62 has been removed, similar masked implanting is carried out for source and drain regions of HV PMOS transistors (which are not shown); a protective dielectric layer 66 is then deposited, providing the structure of FIG. 24, showing an LV NMOS transistor 70, an HV NMOS transistor 71, and an EEPROM cell 72, including a selection transistor 73 and a memory transistor 74. The final steps then follow, including forming the contacts and the electrical interconnection lines, depositing a passivation layer, etc.

Thus, in the final device, EEPROM cells 72 have selection transistor source regions 65a which are not salicided, thus have high breakdown voltages, and are obtained independently of the respective drain regions (regions 50); second source regions 56 of the memory transistors 74 (forming source lines), which are salicided, and have a different doping from selection source regions 65a; control gate lines 43b for the memory transistors 74, and gate regions 43c for the selection transistors 73 with low resistivity; in addition gate regions of selection transistors 73 are obtained entirely from the second polycrystalline silicon layer 43. Furthermore, the cell as a whole is fully non-self-aligned.

LV (NMOS and PMOS) transistors have a high-speed LDD structure with a dual gate (gate region 43a doped with doping ionic species of the same type as source and drain regions 48, 55); with salicided source and drain regions 55 and gate region 43a.

HV (NMOS and PMOS) transistors have a dual gate and drain extension structure, with salicided gate region 43d alone.

The described method thus simultaneously form LV, HV and memory components that have very different characteristics, optimising the necessary number of steps, and using altogether a low number of masks.

Finally, it is apparent that many modifications and variants can be made to the method and the device described and illustrated here, all within the scope of the invention, as defined in the attached claims. In particular, the steps described of forming zener diodes and low-doping precision resistors, and N- and P-type transistors with non-salicided junctions, can be omitted if these components are not needed.

What is claimed is:

1. A method for manufacturing electronic devices, having memory cells and low voltage (LV) transistors with salicided junctions, comprising:

depositing an upper layer of polycrystalline silicon over a substrate of monocrystalline silicon;

defining said upper layer, obtaining first cell gate regions, LV gate regions, and undefined portions;

forming first cell source and drain regions laterally to said first cell gate regions;

forming LV source and drain regions, laterally to said LV gate regions; and forming a silicide layer on said LV source and drain regions, on said LV gate regions, and on said undefined portions.

2. The method of claim 1, further comprising forming high voltage (HV) transistors, and after the step of forming a silicide layer of HV gate regions is carried out.

3. The method of claim 2 wherein said memory cells are EEPROM cells comprising a selection transistor and a memory transistor, and before the step of depositing an upper layer, the following steps are carried out:

a) forming first gate oxide regions on first areas of the substrate of monocrystalline silicon;

b) forming floating gate regions on said first gate oxide regions;

c) forming dielectric regions on said floating gate regions;

d) forming second gate oxide regions on second areas of said substrate, and third gate oxide regions on third areas of said substrate;

and further wherein said LV gate regions cover portions of said second areas and said undefined portions cover said first and said third areas of said substrate;

and, after forming a salicide layer, the following steps are carried out:

e) removing selective portions of said layer of silicide and of said upper layer from above said first and said third areas, thereby forming said HV gate regions on said third areas, as well as gate structures of said selection transistor on said first areas; and f) forming HV source and drain regions in said third areas, adjacent to said HV gate regions, and selection transistor source regions in said first areas, adjacent to said gate structures of said selection transistor.

4. The method of claim 3 wherein before said forming first gate oxide regions step, a step of forming continuity regions in said first areas is carried out;

and simultaneously with the step of forming LV source and drain regions, a source region of said memory transistor is formed;

and the step of forming first cell source and drain regions laterally to said first cell gate regions comprises forming first LV source and drain regions and first cell source and drain regions.

5. The method of claim 4 wherein said forming first gate oxide regions step comprises providing a matrix oxide layer on the entire surface of said substrate; removing said matrix oxide layer from said first area, apart from matrix oxide portions arranged across said continuity regions; and growing a tunnel oxide layer, and wherein said forming floating gate regions and said forming dielectric regions steps comprise:

g) depositing a polycrystalline silicon layer on said tunnel oxide layer;

h) depositing a dielectric layer on said polycrystalline silicon layer; and i) removing selective portions of said dielectric layer, said polycrystalline silicon layer, and said tunnel oxide layer from above said first areas, thereby said floating gate regions are arranged above the tunnel oxide portions, as well as in part of said matrix oxide portions and of said continuity regions.

6. The method of claim 5 wherein said substrate has a first conductivity type, and before the step of forming first gate oxide regions, the following steps are carried out:

first selectively implanting of doping ionic species of a second conductivity type in said first areas of said substrate;

second implanting, separate from the first selectively implanting step, of doping ionic species of the second conductivity type in said second areas of said substrate not overlaying said first and third areas; and third implanting, separate from the first selectively implanting step and the second implanting step, of doping ionic species of the second conductivity type in said third areas of said substrate.

7. The method of claim 5 wherein after said defining said upper layer step, and before said forming a silicide layer step, the following are carried out:

j) implanting doping ionic species forming LV LDD regions aligned with said LV gate regions in said second areas, and intermediate cell source regions in said first areas, aligned with said floating gate regions; and k) forming first and second spacers laterally to said LV gate regions and, respectively, to said floating gate regions and to said undefined regions on said first areas;

and wherein said LV source and drain regions and source regions of said memory transistor are aligned with said first and second spacers, respectively.

8. A method for manufacturing an integrated electronic device, comprising:

forming active regions of high voltage (HV) conductivity and active regions of low voltage (LV) conductivity in a silicon substrate;

forming floating gate regions in a first area of the active regions of HV conductivity;

forming LV gate regions on the LV conductivity regions;

forming LV source and drain regions in the LV conductivity regions and first source and first drain regions in the first area of HV conductivity adjacent the floating gate regions;

forming a silicide layer on the LV source, drain, and gate regions and on the active regions of HV conductivity, including the first area;

removing selected areas of the silicide layer from a second area in the regions of HV conductivity to define HV gate regions; and forming HV source and drain regions adjacent to the HV gate regions.

9. The method of claim 8 wherein forming floating gate regions comprises:

forming first cell gate oxide regions in the first area of the active regions of HV conductivity; and forming floating gate regions with dielectric regions thereon on the first cell gate oxide regions.

10. The method of claim 9, wherein the steps of forming LV gate, source, and drain regions comprise:

depositing an upper layer of polycrystalline silicon;

defining the upper layer to obtain first cell gate regions, LV gate regions, and undefined portions;

forming first cell source and drain regions laterally to the first cell gate regions;

forming LV source and drain regions laterally to the LV gate regions; and wherein forming a silicide layer further comprises forming a silicide layer on the undefined portions.

11. The method of claim 9, further comprising:

forming continuity regions on portions of the HV conductivity regions prior to forming the floating gate regions; and forming floating gate regions comprises providing a matrix oxide layer on the entire surface of the silicon substrate;

removing the matrix oxide layer from the first area of the regions of HV conductivity except for matrix oxide portions formed across the continuity regions; and growing a tunnel oxide layer on the exposed portions of the first area of the regions of HV conductivity.

12. The method of claim 11 wherein forming floating gate regions further comprises:

depositing a polycrystalline silicon layer on the tunnel oxide layer;

depositing a dielectric layer on the polycrystalline silicon layer; and removing selective portions of the dielectric layer, the polycrystalline silicon layer, and the tunnel oxide layer from above the first area in the regions of HV conductivity such that the floating gate regions are arranged above the tunnel oxide portions and in portions of the matrix oxide portions and the continuity regions.

13. The method of claim 12, further comprising prior to forming a silicide layer;

implanting doping ionic species forming LV lightly-doped drain regions aligned with the LV gate regions, and forming intermediate source regions in the first area aligned with the floating gate regions; and forming first and second spacers laterally to the LV gate regions and, respectively, to the floating gate regions and to the undefined regions on the first area; and further wherein forming the LV source and drain regions comprises forming the LV source and drain regions, with the source regions in the first area aligned with the first and second spacers.

* * * * *